(12) United States Patent
Um

(10) Patent No.: US 9,588,708 B2
(45) Date of Patent: Mar. 7, 2017

(54) SEMICONDUCTOR MEMORY DEVICE, OPERATING METHOD THEREOF, AND DATA STORAGE DEVICE INCLUDING THE SAME

(71) Applicant: SK hynix Inc., Gyeonggi-do (KR)

(72) Inventor: Gi Pyo Um, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/214,987

(22) Filed: Jul. 20, 2016

(65) Prior Publication Data

US 2016/0328171 A1 Nov. 10, 2016

Related U.S. Application Data

(62) Division of application No. 14/607,916, filed on Jan. 28, 2015, now Pat. No. 9,424,922.

(30) Foreign Application Priority Data

Aug. 27, 2014 (KR) .......................... 10-2014-0112560

(51) Int. Cl.
*G11C 15/04* (2006.01)
*G06F 3/06* (2006.01)
*G11C 15/00* (2006.01)
*G11C 7/10* (2006.01)
*G11C 7/20* (2006.01)

(52) U.S. Cl.
CPC .......... *G06F 3/0629* (2013.01); *G06F 3/0604* (2013.01); *G06F 3/0673* (2013.01); *G11C 7/1045* (2013.01); *G11C 7/20* (2013.01); *G11C 15/00* (2013.01); *G11C 15/04* (2013.01); *G11C 15/046* (2013.01)

(58) Field of Classification Search
CPC ........ G11C 15/04; G11C 15/00; G11C 15/046
USPC .............................. 365/49.1, 230.03, 230.06
See application file for complete search history.

(56) References Cited

U.S. PATENT DOCUMENTS

2014/0156924 A1* 6/2014 Jeon ...................... G11C 5/148
711/108

* cited by examiner

*Primary Examiner* — Jason Lappas
(74) *Attorney, Agent, or Firm* — IP & T Group LLP

(57) ABSTRACT

A semiconductor memory device includes a setting information area suitable for storing setting information necessary for driving of memory cells, a control logic suitable for loading the setting information stored in the setting information area on a content-addressable memory (CAM) block, a CAM state information storage block suitable for storing information on whether the setting information loaded on the CAM block is changed, wherein when a reloading operation of the setting information stored in the setting information area on the CAM block is requested, the control logic selectively performs the reloading operation based on the information stored the CAM state information storage block.

5 Claims, 7 Drawing Sheets

SEMICONDUCTOR MEMORY DEVICE, OPERATING METHOD THEREOF, AND DATA STORAGE DEVICE INCLUDING THE SAME

CROSS-REFERENCES TO RELATED APPLICATION

This application is a division of U.S. patent application Ser. No. 14/607,916 filed on Jan. 28, 2015, which claims priority under 35 U.S.C. §119(a) to Korean application number 10-2014-0112560, filed on Aug. 27, 2014, in the Korean Intellectual Property Office. The disclosure of each of the foregoing application is incorporated herein by reference in its entirety.

BACKGROUND

1. Technical Field

Various embodiments generally relate to a semiconductor memory device, and more particularly, to a semiconductor memory device capable of omitting a setting information loading operation, an operating method thereof, and a data storage device including the same.

2. Related Art

Semiconductor memory devices are generally divided into volatile and nonvolatile memory devices. While volatile memory devices lose data when their power supply is interrupted, nonvolatile memory devices retain data even without a power supply.

Depending upon the structure and operating scheme of the memory cells, volatile memory devices include static random access memory (SRAM) using flip-flops, dynamic random access memory (DRAM) using capacitors, and synchronous dynamic random access memory (SDRAM) operating in synchronization an external device.

Depending upon the structure and operating scheme of the memory cells, nonvolatile memory devices include NAND flash memory devices, NOR flash memory devices, ferroelectric random access memory (FRAM) using a ferroelectric capacitor, magnetoresistive random access memory (MRAM) using a tunneling magnetoresistance (TMR) layer, phase change random access memory (PRAM) using a chalcogenide alloy, and resistive random access memory (RERAM) using a transition metal oxide.

The paradigm for the computing environment has shifted to ubiquitous computing so that computer systems can be used anytime and anywhere. The use of portable electronic devices such as mobile phones, digital cameras, and notebook computers has rapidly increased. In general, such portable electronic devices use a data, storage device which uses a semiconductor memory device. The data storage device is used as a main memory device or an auxiliary memory device the portable electronic devices.

A data storage device using a semiconductor memory device may provide excellent stability and durability, high information access speed, and low power consumption, since there are no moving parts. Data storage devices having such advantages may include a universal serial bus (USB) memory device, memory cards having various interfaces, a universal flash storage (UFS) device, and a solid state drive (SSD).

SUMMARY

Various embodiments are directed to a semiconductor memory device capable of omitting a setting information loading operation, an operating method thereof, and a data storage device including the same.

In an embodiment, a semiconductor memory device may include a setting information area suitable for storing setting information necessary for driving of memory cells, a control logic suitable for loading the setting information stored in the setting information area on a content-addressable memory (CAM) block, and a CAM state information storage block suitable for storing information on whether the setting information loaded on the CAM block changed, wherein when a reloading operation of the setting information stored in the setting information area on the CAM block is requested, the control logic selectively performs the reloading operation based on the information stored in the CAM state information storage block.

In an embodiment, a data storage device may include a semiconductor memory device including a setting information area suitable for storing setting information necessary for driving of memory cells, a control logic suitable for loading the setting information stored in the setting information area on a content-addressable memory (CAM) block, a CAM state information storage block suitable for storing information on whether the setting information loaded on the CAM block is changed, and a memory controller suitable for requesting the semiconductor memory device to reload the setting information stored in the setting information area on the CAM block wherein the control logic selectively performs an operation of reloading the setting information based on the information stored in the CAM state information storage block.

In an embodiment, a method for operating a semiconductor memory device may include loading setting information necessary for driving of memory cells on a content-addressable memory (CAM) block, determining whether the setting information loaded on the CAM block is changed, and performing or omitting an operation of reloading the setting information on the CAM block, based on a determination result, when the setting information is requested to be reloaded on the CAM block.

DETAILED DESCRIPTION

Figure 1:
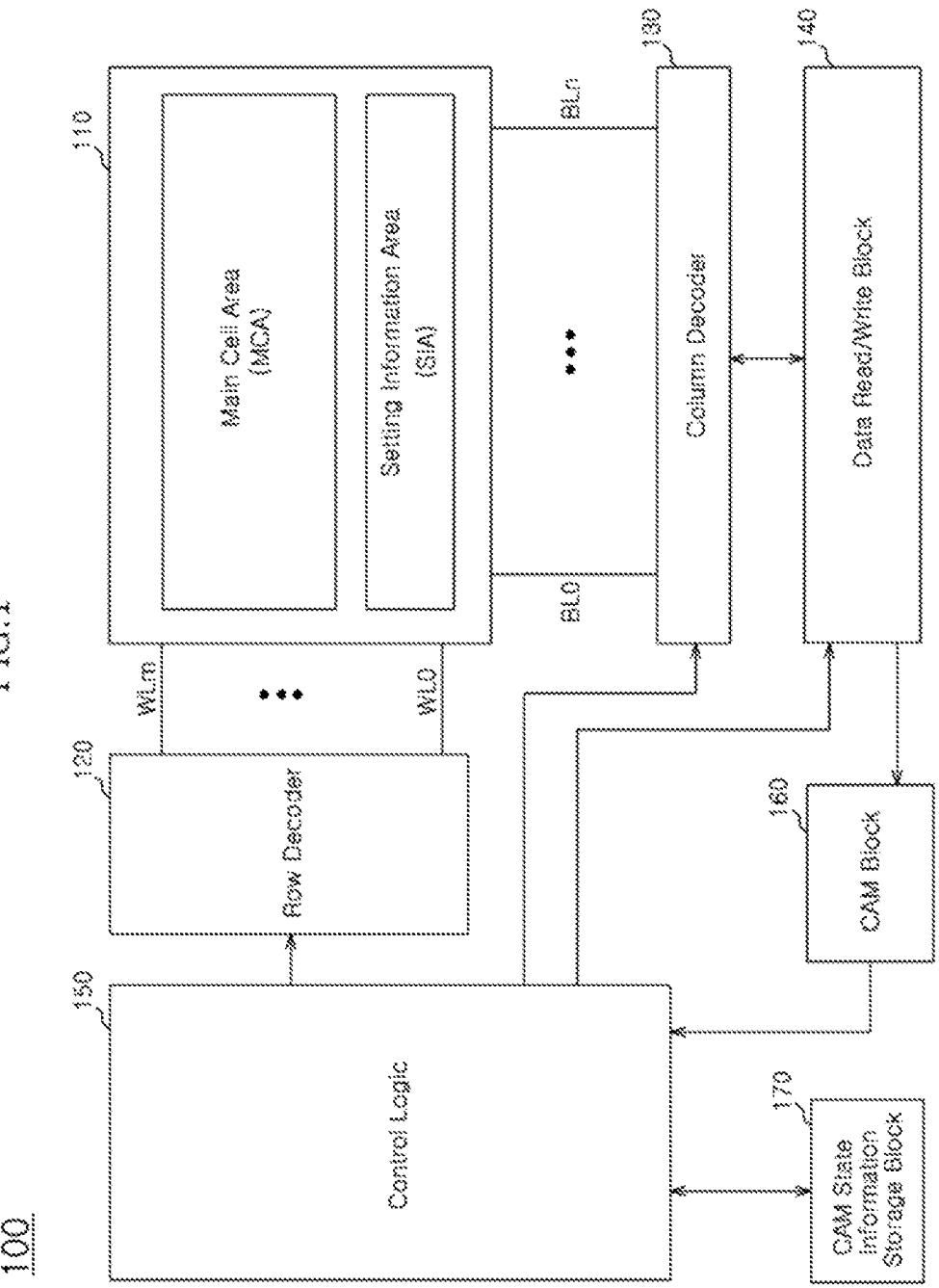
FIG. 1 is a block diagram illustrating a semiconductor memory device accordance with an embodiment.

In the present invention, advantages, features and methods or achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concept of the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify presence of at least one stated feature, step, operation, or element, but do not preclude the presence or addition of one or more other features, steps, operations, and/or elements thereof.

Hereinafter, a semiconductor memory device, an operating method thereof, and a data storage device including the same will be described below with reference to the accompanying drawings through various embodiments of the present invention.

FIG. 1 is a block diagram illustrating a semiconductor memory device in accordance with an embodiment.

Referring to FIG. 1, a semiconductor memory device 100 may include a memory cell array 110, a rove decoder 120, a column decoder 130, a data read/write block 140, a control logic 150, a CAM (content-addressable memory) block 160, and a CAM state information storage block 170.

The memory cell array 110 may include a main cell area MCA and a setting information area SIA. The main cell area MCA may include memory cells for storing the data provided from an external device (not shown) such as a memory controller. The setting information area SIA may include memory cells for storing setting information necessary for the internal operations of the semiconductor memory device 100. The memory cells included in the main cell area MCA and the setting information area SIA may be disposed at regions where word lines WL0 to WLm and bit lines BL0 to BLn cross each other.

Since the setting information SIA is an area for storing setting information, it may be hidden to a user. The setting information stored in the setting information area SIA may include one or more among information on bias levels and bias application times, setting information of the control logic 150, fail address information, repair address information and redundancy information, necessary for the internal operations of the semiconductor memory device 100.

While power is applied to the semiconductor memory device 100 and an initializing operation is performed, the setting information stored in the setting information area SIA may be read through the data read/write block 140. The setting information read may be loaded on the CAM block 160.

For a simple explanation, the CAM block 160 is shown as one function block. However, depending on the contents (or kinds) of the setting information, the CAM block 160 may be included in each of the circuit blocks for driving the memory cell array 110, for example, the row decoder 120, the column decoder 130, the data read/write block 140 and the control logic 150. The setting information loaded on the CAM block 160 may be referred to by each of the circuit blocks during the internal operations of the semiconductor memory device 100.

The row decoder 120 may be electrically coupled with the memory cell array 110 through the word line WL0 to WLm. The row decoder 120 may operate under the control of the control logic 150. The row decoder 120 may decode the addresses provided from the external device. The row decoder 120 may select and drive the word lines WL0 to WLm based on decoding results. For instance, the row decoder 120 may provide the word line driving voltage provided from a voltage generator (not shown), to the word lines WL0 to WLm.

The column decoder 130 may be electrically coupled with the memory cell array 110 through the bit lines BL0 to BLn. The column decoder 130 may operate under the control of the control logic 150. The column decoder 130 may decode the addresses provided from the external device. The column decoder 130 may electrically couple the bit lines BL0 to BLn with the read/write circuits of the data read/write block 140, which respectively correspond to the bit lines BL0 to BLn, based on decoding results. Also, the column decoder 130 may drive the bit lines BL0 to BLn based on decoding results.

The data read/write block 140 may operate under the control of the control logic 150. The data read/write block 140 may operate as a write driver or a sense amplifier according to an operation mode. For example, the data read/write block 140 may operate as a write driver which stores the data provided from the external device in the memory cell array 110, in a write operation. For another example, the data read/write block 140 may operate as a sense amplifier which reads data from the memory cell array 110, in a read operation.

The control logic 150 may control the general operations of the semiconductor memory device 100, based on the control signals provided from the external device. For example, the control logic 150 may control the main operations of the semiconductor memory device 100, such as the read, write and erase operations of the semiconductor memory device 100. The control logic 150 may control supplemental operations, based on the control signals of the external device. For example, the control logic 150 may control a setting information update operation for updating the setting information loaded on the CAM block 160 with the setting information provided from the external device.

The CAM state information storage block 170 may store information on the state of the setting information loaded on the CAM block 160, for example information on whether a change is made to the setting information loaded on the CAM block 160. The CAM state information storage block 170 may store, as a default value, information indicating that setting information is not changed. After performing the setting information update operation, that is, in updating the setting information loaded on the CAM block 160 with the setting information provided from the external device the control logic 150 may update the information stored in the CAM state information storage block 170. For example, the control logic 150 may change the default value and store information indicating that setting information is changed, in the CAM state information storage block 170.

As the occasion demands, the external device may request the semiconductor memory device 100 to reload setting information with a default value. That is to say, the external device may request the semiconductor memory device 100 to reload the setting information stored in the setting information area SIA, on the CAM block 160. If the setting information reloading on the CAM block 160 is requested, the control logic 150 may perform or omit an operation of reloading setting information, based on the information stored in the CAM state information storage block 170. Such selective performing of the setting information reloading operation will be described later in detail with reference to the flow chart of FIG. 3.

Figure 2:
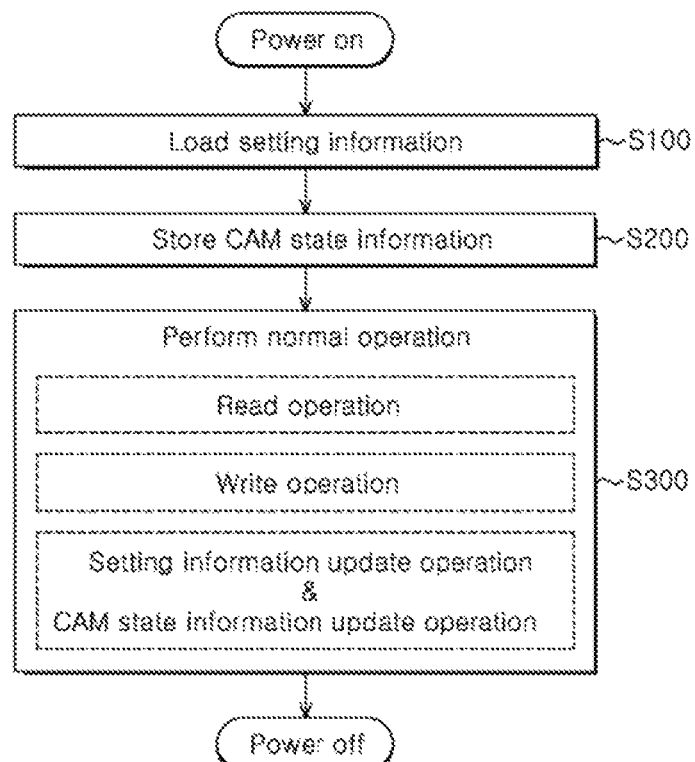
FIG. 2 is a flow chart to assist in the explanation of a method for operating the semiconductor memory device in accordance with the embodiment.

FIG. 2 is a flow chart to assist in the explanation of a method for operating the semiconductor memory device in accordance with the embodiment. A setting information loading process and a setting information update process of the semiconductor memory device 108 will be described below in detail with reference to FIG. 2.

At step S100, if power is supplied to the semiconductor memory device 100, setting information may be loaded as a part of an initializing operation. In other words, the setting information stored in the setting information area SIA may be loaded on the CAM block 160 and may be referred to by function blocks.

After the setting information is loaded on the CAM block 160, at step S200, CAM state information may be stored in the CAM state information storage block 170. Since the initializing, operation performed immediately after the supply of power, information indicating that setting information is not changed may be stored in the CAM state information storage block 170, as a default value.

At step S300, a normal operation of the semiconductor memory device 100 may be performed under the control of the control logic 150 based on a request from the external device. As mentioned above, main operations and supplemental operations may be performed in the normal operation.

For instance, in the normal operation, a read operation and a write operation may be performed for the main cell area MCA, based on a request from the external device. While such operations are performed the setting information loaded on the CAM block 160 may be referred to by function blocks.

For another instance, while performing the normal operation, a setting information update operation for updating the setting information loaded on the CAM block 160 with the setting information provided from the external device may be performed based on a request from the external device. If the setting information update operation is performed, the information stored in the CAM state information storage block 170 may be updated. For example, the information stored in the CAM state information storage block 170 may be changed from information indicating that setting information is not changed to information indicating that setting information is changed.

Figure 3:
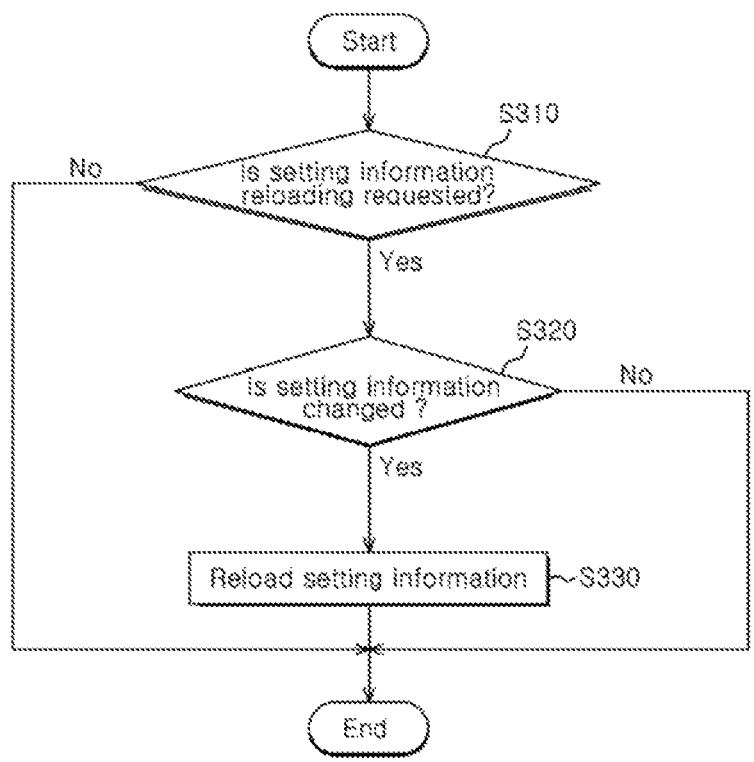
FIG. 3 is a flow chart to assist in the explanation of a method for operating the semiconductor memory device to process a setting information reload request in accordance with the embodiment.

FIG. 3 is a flow chart to assist in the explanation of a method for operating the semiconductor memory device to process a setting information reload request in accordance with the embodiment. In detail, FIG. 3 is a flow chart to assist in the explanation of the operations of the control logic 150 to process a setting information reload request from the external device in the step S300 of FIG. 2, that is, while performing the normal operation.

At step S310 the control logic 150 may determine whether it is requested from the external device that the setting information stored in the setting information area SIA be reloaded on the CAM block 160. Where setting information reloading is not requested, the process may be ended. Where the setting information reloading is requested, the process may proceed to step S320.

At the step S320, the control logic 150 may determine whether the setting information loaded on the CAM block 160 was changed, based on the information stored in the CAM state information storage block 170. For example, where information indicating that setting information was not changed is stored in the CAM state information storage block 170, the control logic 150 may determine that the setting information stored in the setting information area SIA is loaded on the CAM block 160. For another example, where information indicating that setting information was changed is stored in the CAM state information storage block 170, the control logic 150 may determine that the setting information provided from the external device is loaded on the CAM block 160 by the setting information update operation.

According to a determination result of the control logic 150, a setting formation reloading operation may be selectively performed. At step S330, where it is determined that setting information was changed, the control logic 150 may reload the setting information stored in the setting information area SIA, on the CAM block 160. Where it is determined that setting information was not changed, the control logic 150 may omit the setting information reloading operation. As the setting information reloading operation is omitted by the control logic 150, the operating speed or the responding speed of the semiconductor memory device 100 for a setting information reloading request may be increased.

Figure 4:
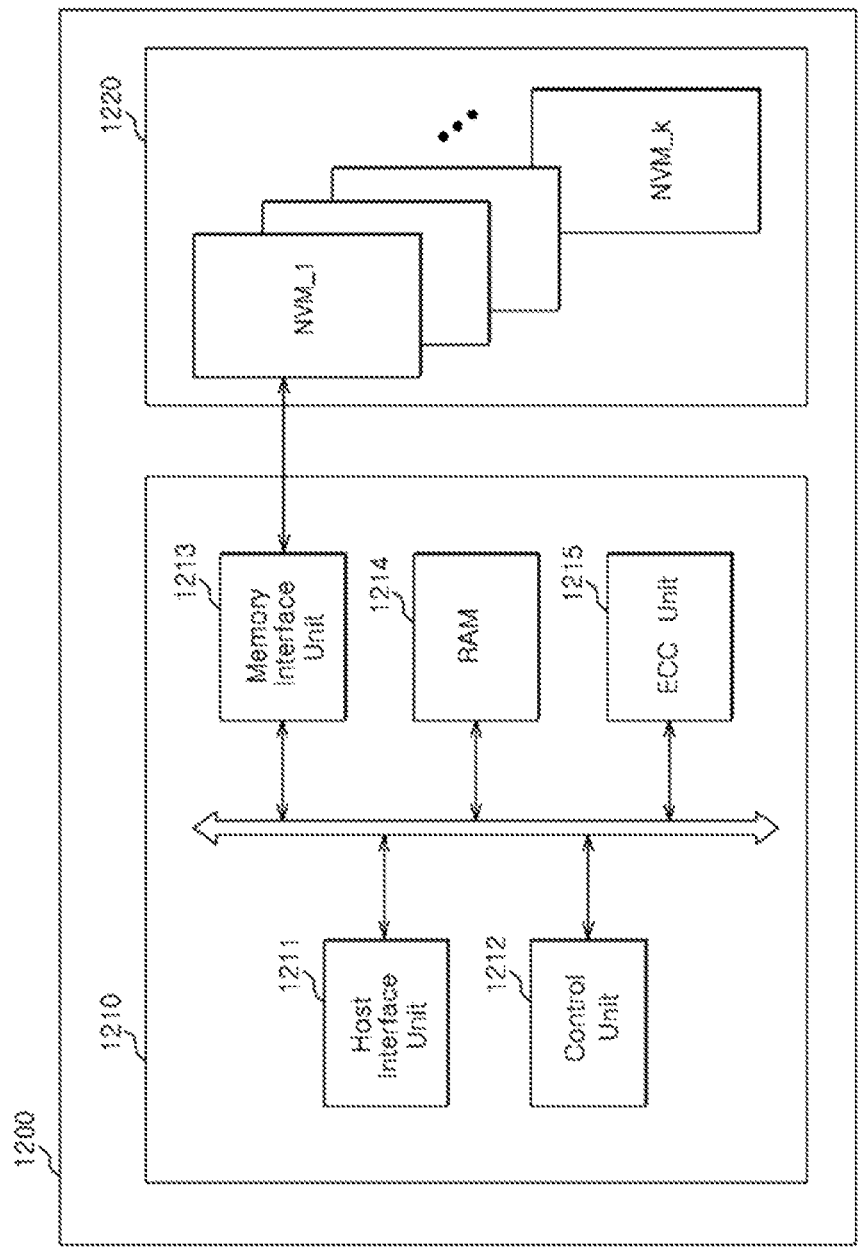
FIG. 4 is a block diagram illustrating a data storage device including a semiconductor memory device in accordance an embodiment.

FIG. 4 is a block diagram illustrating a data storage device including a semiconductor memory device in accordance an embodiment.

The data storage device 1200 may include a controller 1210, and a nonvolatile memory device 1220. The data storage device 1200 may be used by being electrically coupled to a host device (not shown) such as a mobile phone, an MP3 player, a laptop computer, a desktop computer, a game player, a TV, an in-vehicle infotainment system, and so forth.

The controller 210 may be configured to access the nonvolatile memory device 1220 in response to a request from the host device. For example, the controller 1210 may be configured to control the read, program or erase operations of the nonvolatile memory device 1220. The controller 1210 may be configured to drive firmware or software for controlling the nonvolatile memory device 1220.

The controller 1210 may include a host interface unit 1211, a control unit 1212, a memory interface unit 1213, a RAM 1214 and an error correction code (ECC) unit 1215.

The control unit 1212 may be configured to control the general operations of the controller 1210 in response to a request from the host device.

The RAM 1214 may be used as the working memory of the control unit 1212. The RAM 1214 may be used as a buffer memory which temporarily stores the data read from the nonvolatile memory device 1220 or the data provided from the host device.

The host interface unit 1211 may be configured to interface the host device and the controller 1210. For example, the host interface unit 1211 may be configured to communicate with the host device through one of various interface protocols such as a universal serial bus (USB) protocol, a universal flash storage (UFS) protocol, a multimedia card (MMC) protocol, a peripheral component interconnection (PCI) protocol, a PCI express (PCI-E) protocol, a parallel advanced technology attachment (PATA) protocol, a serial advanced technology attachment (ATA) protocol, a small computer system interface (SCSI) protocol, and a serial attached SCSI (SAS) protocol.

The memory interface unit 1213 may be configured to interface the controller 1210 and the nonvolatile memory device 1220. The memory interface unit 1213 may be configured to provide commands and addresses to the nonvolatile memory device 1220. Furthermore the memory interface unit 1213 may be configured to exchange data with the nonvolatile memory device 1220.

The error correction code unit 1215 may be configured to detect an error of the data read from the nonvolatile memory device 1220. Also, the error correction code unit 1215 may be configured to correct the detected error when the detected error is within a correctable range.

The nonvolatile memory device 1220 may be used as the storage medium of the data storage device 1200. The nonvolatile memory device 1220 may include a plurality of nonvolatile memory chips (or dies) NVM_1 to NVM_k. Each of the nonvolatile memory chips NVM_1 to NVM_k, which configure the nonvolatile memory device 1220, may have the same configuration as the semiconductor memory device described above with reference to FIG. 1 and may perform the same operations as the operations of the semiconductor memory device described above with reference to FIGS. 2 and 3.

The controller 1210 and the nonvolatile memory device 1220 may be manufactured as any one of various data storage devices. For example, the controller 1210 and the nonvolatile memory device 1220 may be integrated into one semiconductor device and may be manufactured as any one of a multimedia card in the form of an MMC, are eMMC, an RS-MMC and a micro-MMC, a secure digital card in the form of an SD, a mini-SD and an micro-SD, a universal serial bus (USB) storage device, a universal flash storage (UFS) device, personal computer memory card international association (PCMCIA) card, a compact flash (CF) card, a smart media card, a memory stick, and so forth.

Figure 5:
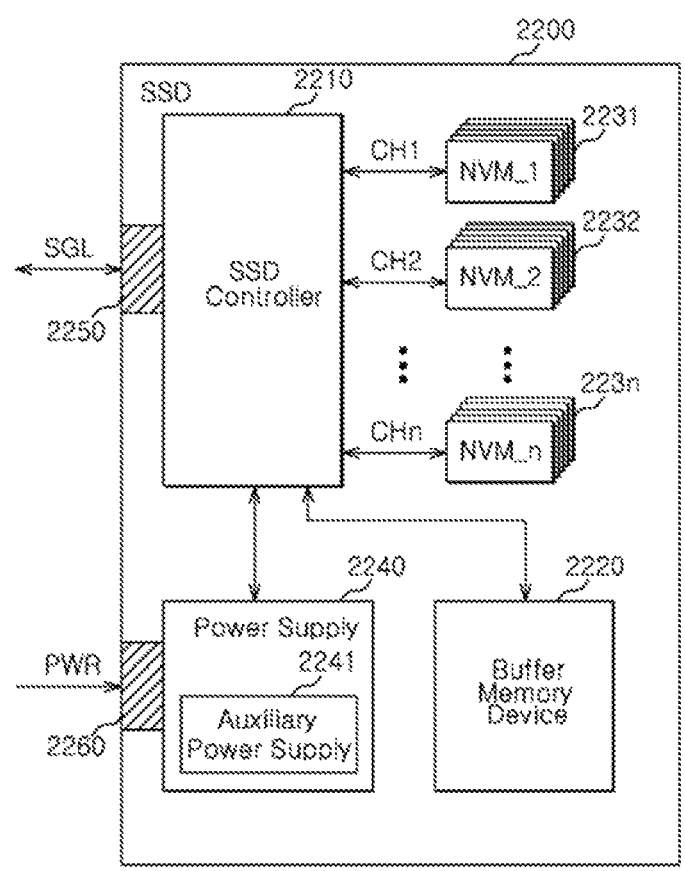
FIG. 5 is a block diagram illustrating a solid state drive (SSD) including a semiconductor memory device in accordance with an embodiment.

FIG. 5 is a block diagram illustrating a solid state drive (SSD) including a semiconductor memory device in accordance with an embodiment.

A solid state drive (SSD) 220 may include an SSD controller 2210, a buffer memory device 2220, nonvolatile memory devices 2231 to 223n, a power supply 2240, a signal connector 2250, and a power connector 2260.

The SSD controller 2210 may be configured to access the nonvolatile memory devices 223 to 223n in response to a request from a host device (not shown) such as a mobile phone, an MP3 player, a laptop computer, a desktop computer, a game player, a an in-vehicle infotainment system, and so forth. For example, the SSD controller 2210 may be configured to control the read, program and erase operations of the nonvolatile memory devices 2231 to 223n.

The buffer memory device 2220 may be configured to temporarily store data which are to be stored in the nonvolatile memory devices 2231 to 223n. Further, the buffer memory device 2220 may be configured to temporarily store data which are read from the nonvolatile memory devices 2231 to 223n. The data temporarily stored in the buffer memory device 2220 may be transmitted to the host device or the nonvolatile memory devices 2231 to 223n under the control of the SSD controller 2210.

The nonvolatile memory devices 2231 to 223n may be used as storage media of the SSD 2200. Each of the nonvolatile memory chips 2231 to 223n may have the same configuration as the semiconductor memory device described above with reference to FIG. 1 and may perform the same operations as the operations of the semiconductor memory device described above with reference to FIGS. 2 and 3. The nonvolatile memory devices 2231 to 223n may be electrically coupled to the SSD controller 2210 through a plurality of channels CH1 to CHn, respectively. One or more nonvolatile memory devices may be electrically coupled to one channel. The nonvolatile memory devices electrically coupled to one channel may be electrically coupled to the same signal bus and data bus.

The power supply 2240 may be configured to provide power PWR, inputted through the power connector 2260, to the inside of the SSD 2200. The power supply 2240 may include an auxiliary power supply 2241. The auxiliary power supply 2241 may be configured to supply power to allow the SSD 2200 to be properly terminated when a sudden power-off occurs. The auxiliary power supply 2241 may include super capacitors capable of being charged with the power PWR.

The SSD controller 2210 may exchange a signal SGL with the host device through the signal connector 2250. The signal SGL may include a command, an address, data, and so forth. The signal connector 2250 may be configured as one of many connectors for various protocols such as parallel advanced technology attachment (PATA), serial advanced technology attachment (SATA), small computer system interface (SCSI), serial attached SCSI (SAS), peripheral component interconnection (PCI) and PCI express (PCI-E) protocols, depending on the interface scheme between the host device and the SSD 2200.

Figure 6:
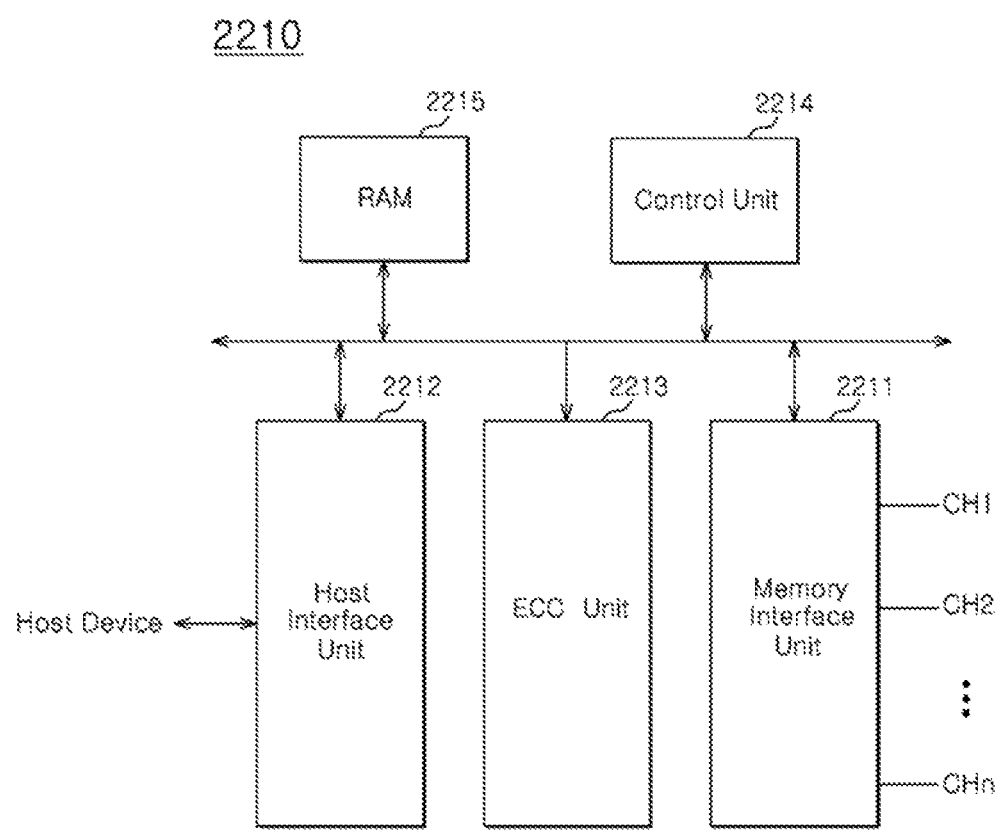
FIG. 6 is a block diagram illustrating an SSD controller shown in FIG. 5.

FIG. 6 is a block diagram illustrating the SSD controller 2210 shown in FIG. 5. Referring to FIG. 6, the SSD controller 2210 may include a memory interface unit 2211, a host interface unit 2212, an error correction code (ECC) unit 2213, a control unit 2214, and a RAM 2215.

The memory interface unit 2211 may be configured to provide a control signal such as a command and an address to the nonvolatile memory devices 2231 to 223n. Moreover, the memory interface unit 2211 may be configured to exchange data with the nonvolatile memory devices 2231 to 223n. The memory interface unit 2211 may scatter the data transmitted from the buffer memory device 2220 to the channels CH1 to CHn, under the control of the control unit 2214. Furthermore, the memory interface unit 2211 may transmit the data read from the nonvolatile memory devices 2231 to 223n to the buffer memory device 2220, under the control of the control unit 2214.

The host interface unit 2212 may be configured to provide an interface with the SSD 2200 in correspondence to the protocol of the host device. For example, the host interface unit 2212 may be configured to communicate with the host device through one of parallel advanced technology attachment (PATA), serial advanced technology attachment (SATA), small computer system interface (SCSI), serial attached SCSI (SAS), peripheral component interconnection (PCI) and PCI express (PCI-E) protocols. In addition, the host interface unit 2212 may perform a disk emulating function of supporting the host device to recognize the SSD 2200 as a hard disk drive (HDD).

The ECC unit 2213 may be configured to generate parity bits based on the data transmitted to the nonvolatile memory devices 2231 to 223n. The generated parity bits may be stored in spare areas of the nonvolatile memory devices 2231 to 223n. The ECC unit 2213 may be configured to detect an error of the data read from the nonvolatile memory devices 2231 to 223n. When the detected error is within a correctable range, the ECC unit 2213 may be configured to correct the detected error.

The control unit 2214 may be configured to analyze and process the signal SGL inputted from the host device. The control unit 2214 may control the general operations of the SSD controller 2210 in response to a request from the host device. The control unit 2214 may control the operations of the buffer memory device 2220 and the nonvolatile memory devices 2231 to 223n based on firmware for driving the SSD 2200. The RAM 2215 may be used as a working memory for driving the firmware.

Figure 7:
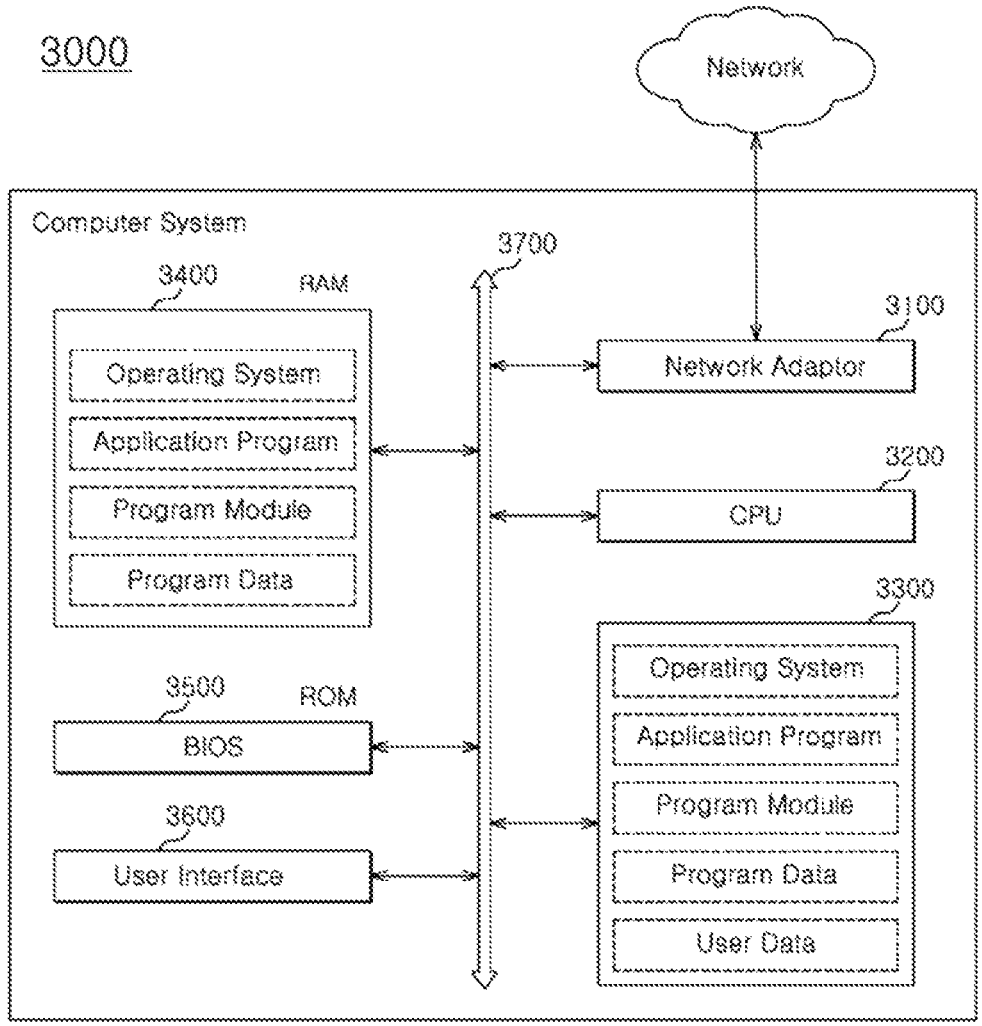
FIG. 7 is a block diagram illustrating a computer system in which a data storage device is mounted, in accordance with an embodiment.

FIG. 7 is a block diagram illustrating a computer system in which a data storage device is mounted, in accordance with an embodiment. Referring to FIG. 6, a computer system 3000 includes a network adaptor 3100, a central processing unit 3200, a data storage device 3300, a RAM 3400, a ROM 3500 and a user interface 3600, which are electrically coupled to a system bus 3700. The data storage device 3300 may be configured by the data storage device 1200 shown in FIG. 4 or the SSD 2200 shown in FIG. 5.

The network adaptor 3100 provides interfacing between the computer system 3000 and external networks. The central processing unit 3200 performs general operations for driving an operating system or an application program loaded on the RAM 3400.

The data storage device 3300 stores general data necessary in the computer system 3000. For example, an operating system for driving the computer system 3000, an application program, various program modules, program data and user data are stored in the data storage device 3300.

The RAM 3400 may be used as a working memory device of the computer system 3000. Upon booting the operating system, the application program, the various program modules and the program data necessary for driving programs, which are read from the data storage device 3300, are loaded on the RAM 3400. A BIOS (basic input/output system) which is activated before the operating system is driven is stored in the ROM 3500. Information exchange between the computer system 3000 and a user is implemented through the user interface 3600.

As is apparent from the above descriptions, according to the embodiments, a semiconductor memory device may omit a setting information loading operation, based on whether setting information is changed. As a consequence, the operation speed of the semiconductor memory device may be improved.

While various embodiments have been described above, it will be understood to those skilled in the art that the embodiments described are by way of example only. Accordingly, the semiconductor memory device, the operating method thereof, and the data storage device including the same described herein should not be limited based on the described embodiments.

What is claimed is:

1. A semiconductor memory device comprising:
   a setting information area suitable for storing setting information necessary for driving of memory cells;
   a control logic suitable for loading the setting information stored in the setting information area on a content-addressable memory (CAM) block; and
   a CAM state information storage block suitable for storing information on whether the setting information loaded on the CAM block is changed,
   wherein when a reloading operation of the setting information stored in the setting information area on the CAM block is requested, the control logic selectively performs the reloading operation based on the information stored in the CAM state information storage block.

2. The semiconductor memory device according to claim 1, wherein the control logic omits the reload operation when the information stored in the CAM state information storage block indicates that the setting information loaded on the CAM block is not changed, even though the reloading operation is requested.

3. The semiconductor memory device according to claim 1, wherein the control logic performs the reloading operation when the information stored in the CAM state information storage block indicates that the setting information loaded on the CAM block is changed and the reloading operation is requested.

4. The semiconductor memory device according to claim 1, wherein the control logic loads new setting information on the CAM block, when the control logic is requested to update the setting information loaded on the CAM block, with the new setting information provided from an external device.

5. The semiconductor memory device according to claim 4, wherein, after loading the new setting information on the CAM block, the control logic stores information indicating that the setting information loaded on the CAM block is changed, on the CAM state information storage block.

* * * * *